United States Patent
Yang

(10) Patent No.: US 12,407,430 B2
(45) Date of Patent: Sep. 2, 2025

(54) DIRECT CURRENT OFFSET CALIBRATION DEVICE ON THE RECEIVING PATH AND DIRECT CURRENT OFFSET CALIBRATION METHOD THEREOF

(71) Applicant: RichWave Technology Corp., Taipei (TW)

(72) Inventor: Shun-Pin Yang, Taipei (TW)

(73) Assignee: RichWave Technology Corp., Taipei (TW)

( * ) Notice: Subject to any disclaimer, the term of this patent is extended or adjusted under 35 U.S.C. 154(b) by 452 days.

(21) Appl. No.: 18/082,592

(22) Filed: Dec. 16, 2022

(65) Prior Publication Data

US 2024/0187112 A1   Jun. 6, 2024

(30) Foreign Application Priority Data

Dec. 5, 2022  (TW) .................. 111146525

(51) Int. Cl.
| | | |
|---|---|---|
| *H04B 17/21* | (2015.01) | |
| *H03D 3/00* | (2006.01) | |
| *H04B 17/00* | (2015.01) | |

(52) U.S. Cl.
CPC ............. *H04B 17/21* (2015.01); *H03D 3/008* (2013.01); *H04B 17/0085* (2013.01); *H03D 2200/0047* (2013.01)

(58) Field of Classification Search
CPC ...... H04B 17/21; H04B 17/0085; H04B 1/30; H04B 1/40; H04B 2001/305; H03D 3/008; H03D 2200/0047; H04L 25/06
See application file for complete search history.

(56) References Cited

U.S. PATENT DOCUMENTS

| | | | |
|---|---|---|---|
| 8,665,931 B2 | 3/2014 | Afsahi | |
| 2002/0151289 A1* | 10/2002 | Rahman | H03D 3/006 455/234.1 |
| 2006/0223457 A1 | 10/2006 | Rahman | |

(Continued)

FOREIGN PATENT DOCUMENTS

| | | |
|---|---|---|
| CN | 105850063 A | 8/2016 |
| TW | I685669 B | 2/2020 |

(Continued)

OTHER PUBLICATIONS

Office action mailed on Sep. 4, 2023 for the Taiwan application No. 111146525, filing date Dec. 5, 2022, p. 1-4., Sep. 4, 2023.

*Primary Examiner* — Tejis Daya
(74) *Attorney, Agent, or Firm* — Winston Hsu

(57) ABSTRACT

A direct current (DC) offset calibration device and a method are used to calibrate a DC offset of a unit. The DC offset calibration device includes a signal generation unit, a to-be-calibrated unit, a measurement unit, and a compensation unit. The DC offset calibration method includes: using the to-be-calibrated unit to output a clipped signal resulting from a signal saturation effect; receiving a receiving signal correlated to the clipped signal, the receiving signal including an even harmonic resulting from the clipped signal; measuring a magnitude of the even harmonic to obtain a DC offset adjustment value accordingly; and adjusting the to-be-calibrated unit according to the DC offset adjustment value to calibrate the DC offset.

20 Claims, 5 Drawing Sheets

(56) References Cited

U.S. PATENT DOCUMENTS

| | | | |
|---|---|---|---|
| 2012/0177161 A1* | 7/2012 | Husted | H04L 27/0014 375/371 |
| 2014/0161208 A1 | 6/2014 | Lim | |
| 2024/0255599 A1* | 8/2024 | Fortney | H03M 1/662 |

FOREIGN PATENT DOCUMENTS

| | | |
|---|---|---|
| TW | I764420 B | 5/2022 |
| TW | 202226769 A | 7/2022 |

\* cited by examiner

DIRECT CURRENT OFFSET CALIBRATION DEVICE ON THE RECEIVING PATH AND DIRECT CURRENT OFFSET CALIBRATION METHOD THEREOF

TECHNICAL FIELD

The present invention relates to electronic circuits, and in particular, to a DC offset calibration device on a receiving path and a DC offset calibration method thereof.

BACKGROUND

In an electronic circuit, a signal may have a DC offset due to factors such as an impedance value error, thereby causing signal distortion. The circuit may not be able to maintain a good performance. In related art, a DC offset measurement circuit can be arranged in the signal transmission path of the communication circuit, so as to measure and detect the DC offset of the transmission signal, and accordingly calibrate or compensate for the DC offset. However, this may increase circuit complexity and circuit area. In addition, in some circuit designs, the DC offset measurement circuit may not be necessary in the signal transmission path, and in this condition, although the DC offset may be adjusted manually, it is often time consuming and the DC offset may not be effectively eliminated as desired.

SUMMARY

According to an embodiment of the invention, a direct current (DC) offset calibration device includes a signal generation unit, a to-be-calibrated unit, a measurement unit, and a compensation unit. The signal generation unit may provide a first signal. The to-be-calibrated unit is coupled to the signal generation unit, and configured to receive the first signal and output a second signal accordingly. The second signal is a clipped signal. The measurement unit is coupled to the to-be-calibrated unit and configured to receive a receiving signal correlated to the second signal. The receiving signal may comprise an even harmonic resulted from the clipped signal, and the measurement unit is configured to measure a magnitude of the even harmonic. The compensation unit is coupled to the measurement unit and the to-be-calibrated unit. The compensation unit is used to compute and obtain a DC offset adjustment value according to the magnitude of the even harmonic, and to adjust the to-be-calibrated unit according to the DC offset adjustment value.

According to another embodiment of the invention, a DC offset calibration method is provided and the method may be used to calibrate a DC offset of a to-be-calibrated unit. The to-be-calibrated unit may output a second signal, and the second signal is clipped due to a signal saturation effect of the to-be-calibrated unit. The second signal may be clipped asymmetrically further due to the DC offset of the to-be-calibrated unit. A receiving signal correlated to the second signal may be received, and the receiving signal includes an even harmonic resulting from the asymmetrical clipping. A magnitude of the even harmonic may be measured. A DC offset adjustment value may be computed according to the magnitude of the even harmonic. Then, the to-be-calibrated unit may be adjusted according to the DC offset adjustment value to calibrate the DC offset.

DETAILED DESCRIPTION

Figure 1:
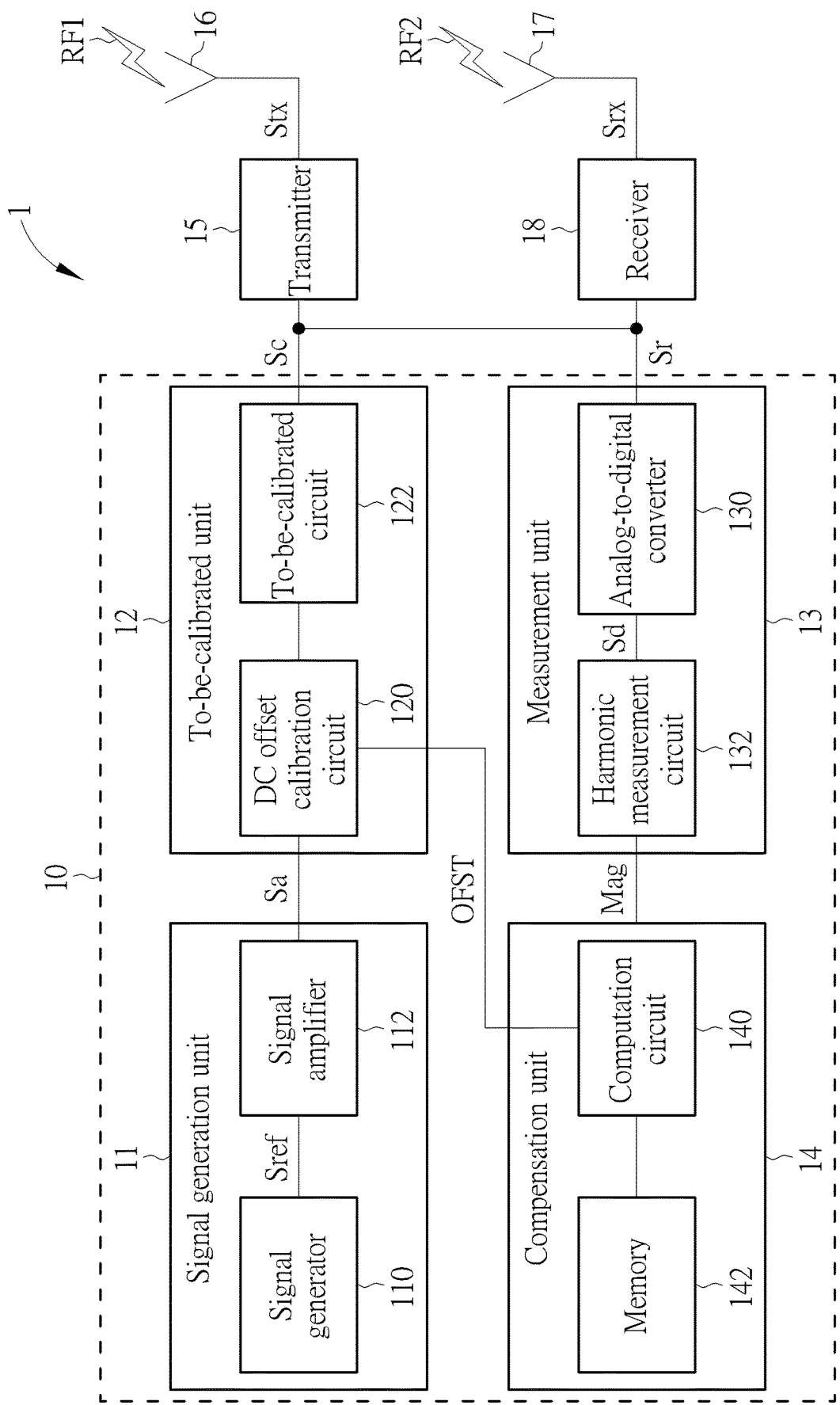
FIG. 1 is a block diagram of a communication circuit according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The terms "module" and "unit" as used herein generally represent software, firmware, hardware, or a combination thereof.

FIG. 1 is a block diagram of a communication circuit 1 according to an embodiment of the invention. The communication circuit 1 includes a direct current (DC) offset calibration device 10, a transmitter 15, a transmitting antenna 16, a receiving antenna 17 and a receiver 18. In some embodiments, the transmitting antenna 16 and/or the receiving antenna 17 may include conventional radio frequency antennas. For example, the antennas may include, but are not limited to, shortwave antennas, ultrashort wave antennas and microwave antennas depending on different operating frequency bands. The antennas may include, but are not limited to, omnidirectional antennas and directional antennas depending on different directivity. The antennas may also include, but are not limited to, linear antennas and planar antennas according to different shapes.

In some embodiments, the DC offset calibration device 10 may include a signal generation unit 11, a to-be-calibrated unit 12, a measurement unit 13 and a compensation unit 14. The signal generation unit 11, the to-be-calibrated unit 12, a transmitter 15 and a transmitting antenna 16 may be coupled in sequence to form part of a signal transmission path. The receiving antenna 17, the receiver 18, the measurement unit 13 and the compensating unit 14 may be coupled in sequence to form part of a signal receiving path. In other words, the signal generation unit 11 and the to-be-calibrated unit 12 may be arranged in the signal transmission path, and the measurement unit 13 and the compensation unit 14 may be arranged in the signal receiving path. In some embodiments, the measurement unit 13 and the compensation unit 14 may be integrated together.

Figures 3, 4:
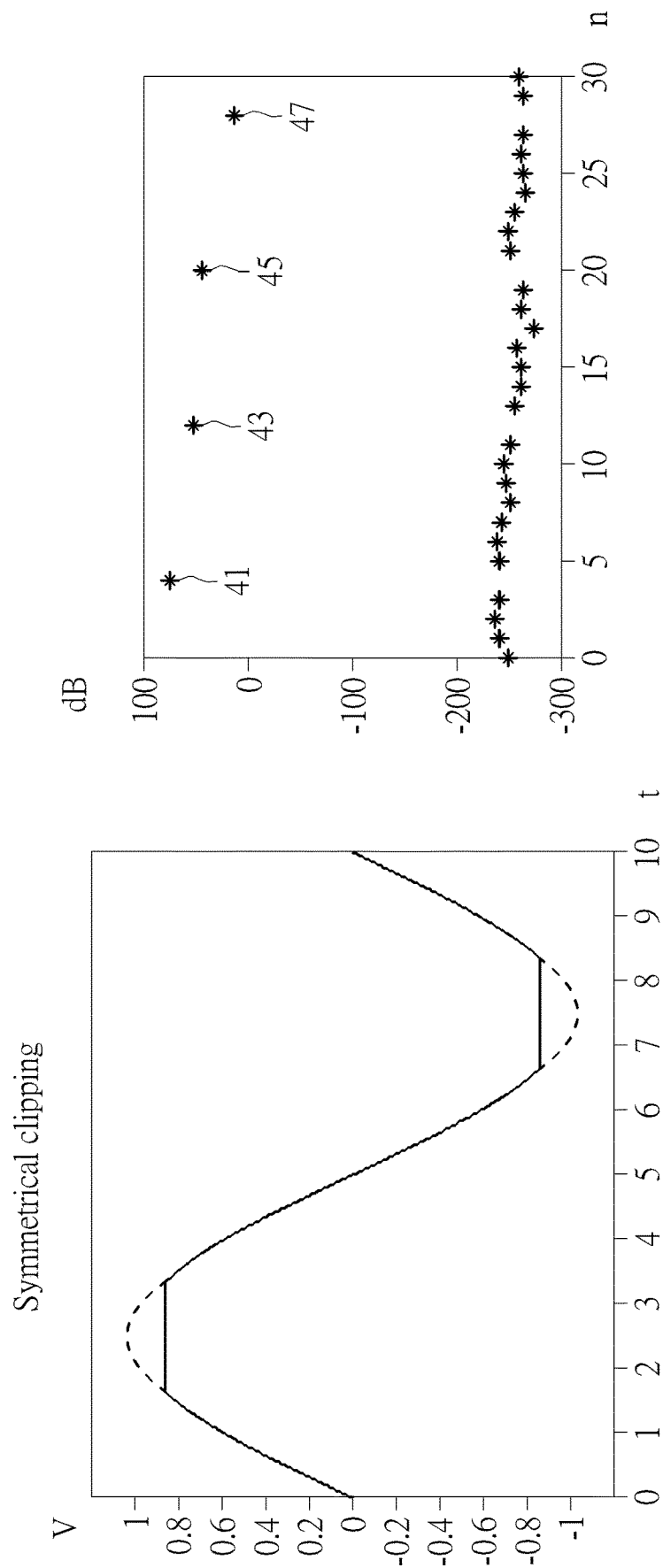
FIG. 3 shows a waveform symmetrically clipped according to an embodiment of the present invention.
FIG. 4 shows the frequency components of the waveform in FIG. 3.
Figures 5, 6:
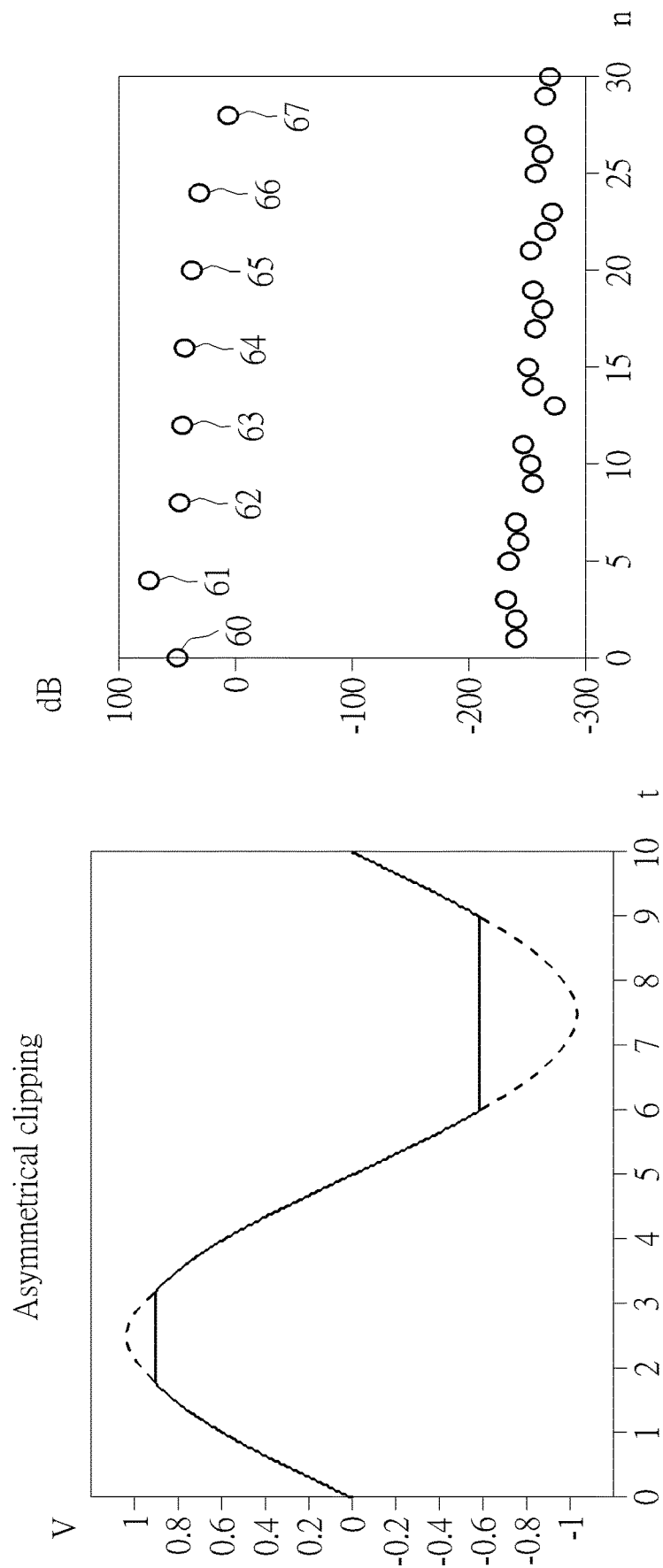
FIG. 5 shows a waveform asymmetrically clipped according to an embodiment of the present invention.
FIG. 6 shows the frequency components of the waveform in FIG. 5.

In the above embodiments, the signal generation unit 11 may provide a first signal Sa. The to-be-calibrated unit 12 may be coupled to the signal generation unit 11 and receive the first signal Sa. The to-be-calibrated unit 12 may output the second signal Sc according to the first signal Sa, and the second signal Sc is clipped. That is, the second signal Sc may be a clipped signal. Further, the clipped signal may be a symmetrical clipped signal or an asymmetrically clipped signal as shown in FIGS. 3 and 5 respectively, and description will be explained in the following paragraphs. The measurement unit 13 may be coupled to the to-be-calibrated unit 12, and may receive a receiving signal Sr correlated to the second signal Sc. The receiving signal Sr includes even harmonics resulted from the clipped signal. The measurement unit 13 may measure a magnitude Mag of an even harmonic. The compensation unit 14 may be coupled to the measurement unit 13, and may compute the DC offset adjustment value OFST according to the magnitude Mag of the even harmonic. The compensation unit 14 may be further coupled to the to-be-calibrated unit 12, such that the to-be-calibrated unit 12 may receive the DC offset adjustment value OFST and may be adjusted accordingly, so as to reduce or eliminate the DC offset of the to-be-calibrated unit 12.

In some embodiments, the signal generation unit 11 may include a signal generator 110 and a signal amplifier 112. The to-be-calibrated unit 12 may include a DC offset calibration circuit 120 and a to-be-calibrated circuit 122. The signal generator 110, the signal amplifier 112, the DC offset calibration circuit 120, the to-be-calibrated circuit 122 and the transmitter 15 may be coupled in sequence.

In the above embodiments, the signal generator 110 may generate a reference signal Sref. In some embodiments, the signal generator 110 may include a sine wave generator, and the reference signal Sref may include a sine wave. The signal amplifier 112 may receive the reference signal Sref, and amplify the reference signal Sref based on a predetermined gain, so as to output the first signal Sa. In some embodiments, the first signal Sa may have a first amplitude. The signal amplifier 112 may include a variable gain amplifier. The gain of the signal amplifier 112 may be set differently for various to-be-calibrated units. For example, the gain of the signal amplifier 112 may be set to amplify the reference signal Sref generated from the signal generator 110, such that the amplified signal, i.e., the first signal Sa, may have a first amplitude which exceeds the linear operating range of the to-be-calibrated unit 12. In other words, the to-be-calibrated unit 12 is saturated. As a result, clipping occurs in the output signal (i.e., the second signal Sc) of the to-be-calibrated unit 12. In this embodiment, for different to-be-calibrated units 12, the signal amplifier 112 may be operated with different predetermined gains, and the predetermined gains may be stored in an internal register of the signal amplifier 112. When performing DC offset calibration for the to-be-calibrated unit 12, the signal amplifier 112 may read a corresponding predetermined gain from the internal register, and amplify the reference signal Sref according to this predetermined gain. In some embodiments, the maximum gain of the signal amplifier 112 may also be used as the predetermined gain. In some embodiments, the second signal Sc may have a second amplitude. As mentioned above, since the first amplitude of the first signal Sa exceeds the linear operating range of the to-be-calibrated unit 12, clipping occurs in the second signal Sc.

In some embodiments, in the to-be-calibrated unit 12, the to-be-calibrated circuit 122 may be, but is not limited to, a digital-to-analog converter (DAC) which may be used to convert a digital signal into an analog signal. In other embodiments, the to-be-calibrated circuit 122 may also include an analog-to-digital converter (ADC), a mixer, a power amplifier (PA), a low-noise amplifier (LNA), an operation Amplifiers (OP), and a combination thereof. Further, in an embodiment where the to-be-calibrated circuit 122 is a power amplifier (PA), the power amplifier may include, for example, a variable gain amplifier (VGA) and a transconductance amplifier.

In some embodiments, the second signal Sc output from the to-be-calibrated unit 12 may be an analog signal. In FIG. 1, the second signal Sc may be sent out via the transmitter 15 and the transmitting antenna 16 to generate the first wireless signal RF1. Specifically, the transmitter 15 may include a mixer, a filter, and a power amplifier. The mixer may up-convert the second signal Sc to the radio frequency range, the power amplifier may amplify the up-converted signal, and the filter may filter the up-converted signal or the amplified signal for the transmitter 15 to transmit a transmitting signal Stx. The transmitting antenna 16 may transmit the transmitting signal Stx to generate the first wireless signal RF1.

In some embodiments, the receiving antenna 17 may receive the second wireless signal RF2 correlated to the first wireless signal RF1, and generate a receiving signal Srx according to the second wireless signal RF2, and the receiver 18 may generate the receiving signal Sr according to the receiving signal Srx. Specifically, the receiver 18 may include a low noise amplifier, a mixer and a filter. In the receiver 18, the low noise amplifier may amplify the signal Srx, the filter may filter out the noise from the amplified signal, and the mixer may down-convert the filtered signal to generate the receiving signal Sr. In such a case, the receiving signal Sr is correlated to the second signal Sc.

In some embodiments, the measurement unit 13 may include an analog-to-digital converter 130 and a harmonic measurement circuit 132. The compensation unit 14 may include a computation circuit 140 and a memory 142. The receiver 18, the analog-to-digital converter 130, the harmonic measurement circuit 132 and the computation circuit 140 may be coupled in sequence. In detail, the computation circuit 140 of the compensation unit 14 may be coupled to the DC offset calibration circuit 120 of the to-be-calibrated unit 12, and the memory 142 may be coupled to the computation circuit 140 in the compensation unit 14.

In other embodiments, the analog-to-digital converter 130 of the measurement unit 13 may also be coupled to the to-be-calibrated circuit 122 of the to-be-calibrated unit 12 to receive the second signal Sc from the to-be-calibrated circuit 122. In such a case, the second signal Sc is the receiving signal Sr.

In a further embodiment, the analog-to-digital converter 130 of the measurement unit 13 may convert the receiving signal Sr from analog to digital form to generate a digital signal Sd, and the harmonic measurement circuit 132 may obtain magnitudes Mag of even harmonics based on the digital signal Sd. For example, the harmonic measurement circuit 132 may perform a time-domain-to-frequency-domain conversion on the digital signal Sd using fast Fourier transform or other discrete Fourier transforms to obtain the magnitudes of the fundamental frequency and other harmonics, as depicted in FIG. 4 and FIG. 6. Description will be explained in the following paragraphs. The harmonics may include even harmonics, such as the DC component (0th harmonic), the 2nd harmonics, 4th harmonics, and others.

In the above embodiment, the computation circuit 140 of the compensation unit 14 may perform computations according to the magnitudes Mag to obtain the DC offset adjustment value OFST. Furthermore, the DC offset calibration circuit 120 of the to-be-calibrated unit 12 may change the DC level of the to-be-calibrated circuit 122 according to the DC offset adjustment value OFST, thereby changing the DC level of the to-be-calibrated unit 12. For example, the DC offset calibration circuit 120 may include a variable resistor, which may change the resistance according to the DC offset adjustment value OFST, so as to change the DC level of the to-be-calibrated unit 12. In some other embodiments, the DC offset calibration circuit 120 may include a DC compensation circuit, which may provide a calibration value according to the DC offset adjustment value OFST, to compensate for the DC level of the to-be-calibrated unit 12.

In the above embodiment, the DC offset calibration circuit 120 may adjust the to-be-calibrated unit 12 according to the DC offset adjustment value OFST, and consequently, the magnitude Mag of a next even harmonic measured by the measurement unit 13 may be reduced, for example, reduced to be equal to or less than a predetermined value. For example, at a time t1, the measurement unit 13 measures the magnitude of an even harmonic as the first magnitude, the computation circuit 140 may then obtain a DC offset adjustment value OFST as the first DC offset adjustment value. The DC offset calibration circuit 120 adjusts the to-be-calibrated unit 12 according to the first DC offset adjustment value, such that, at a subsequent time t2, the measurement unit 13 measure the magnitude of the even harmonic as the second magnitude and the second magnitude is less than the first magnitude. In the above embodiment, the variation trend of the magnitudes of an even harmonic may be used to assist in determining the calibration direction of the DC offset. For example, in the above adjustment process, in the case where the DC offset calibration circuit 120 is a variable resistor, the DC offset calibration circuit 120 may raise the resistance thereof according to the first DC offset adjustment value (e.g., the initial DC offset adjustment value), so that the measurement unit 13 may measure the magnitude of the even harmonic as the third magnitude at time t3 subsequent to time t1. If the third magnitude is larger than the first magnitude, it may be determined that the calibration direction of the DC offset calibration circuit 120 is wrong. Consequently, the calibration direction may be changed, for example, the resistance of the variable resistor may be reduced to achieve the purpose of reducing the magnitude of the even harmonic.

In the above embodiment, the memory 142 may store the predetermined value, the magnitudes Mag of the even harmonic, and the DC offset adjustment values OFST. For example, the memory 142 may store the magnitudes Mag of selected even harmonics, such as the magnitude of the 2nd harmonic, the magnitude of the 4th harmonic, the magnitude of the 6th harmonic, or the magnitudes of all the even harmonics. When the magnitude Mag of an even harmonic is larger than or equal to the predetermined value, it is determined that the to-be-calibrated unit 12 needs to be calibrated for the DC offset thereof. The computation circuit 140 may output the DC offset adjustment value OFST to the DC offset calibration circuit 120 to compensate for the DC offset. When the magnitude Mag of the even harmonic is less than the predetermined value, it is determined that the to-be-calibrated unit 12 may not need to perform a DC offset compensation, and the computation circuit 140 may not output the DC offset adjustment value OFST or may output a DC offset adjustment value OFST equal to zero to the DC offset calibration circuit 120.

In some embodiments, the predetermined value is set according to the sensitivity of the measurement unit 13, or according to the system specification of the communication circuit where the DC offset calibration circuit 120 is used. In detail, taking the sensitivity of the measurement unit 13 for example, sine the sensitivity may be correlated to a noise level of the measurement unit 13, the lower the noise level, the higher the sensitivity of the measurement unit 13. The predetermined value may be set to be equal to or higher than the noise level. If the predetermined value is set to be equal to the noise level as an example, when the magnitude Mag of the even harmonic measured by the measurement unit 13 is higher than the noise level, it is determined that the even harmonic is detected, and the DC offset of the to-be-calibrated unit is required to be calibrated. During the calibration process, the to-be-calibrated unit 12 is adjusted according to the DC offset adjustment value OFST until the magnitude Mag of the even harmonic measured by the measurement unit 13 is equal to or less than the noise level. When the magnitude of the even harmonic is less than the sensitivity (for example, less than the noise level), it is determined that the magnitude value of the even harmonic measured by the measurement unit 13 is unreliable, and it is unnecessary to calibrate the DC offset of the to-be-calibrated unit 12.

In some embodiments, the computation circuit 140 may sweep across all DC offset adjustment values OFST in a predetermined range by a predetermined step size (i.e., interval), and store the DC offset adjustment values OFST and the magnitudes Mag of a selected even harmonic in the memory 142. For example, the predetermined step size may be 500 millivolts (mV), the predetermined range may be between −1000 mV and 1000 mV, and the computation circuit 140 may sweep five DC offset adjustment values between −1000 mV and 1000 mV at intervals of 500 mV OFST. The DC offset of the to-be-calibrated unit 12 is calibrated according to the five DC offset adjustment values OFST respectively, and the measurement unit 13 may then obtain five corresponding magnitudes Mag after each calibration. The five DC offset adjustment values OFST and the five corresponding magnitudes Mag are stored in the memory 142. Later, the DC offset adjustment value OFST corresponding to the minimum magnitude Mag is output to the DC offset calibration circuit 120 for the DC offset compensation.

The following will be explained with reference to FIGS. 3 to 6. If there is a DC offset in the to-be-calibrated unit 12, asymmetrical clipping will occur in the second signal Sc, i.e., the peaks and valleys of the second signal Sc are clipped to different degrees. Consequently, the receiving signal Sr will include even harmonics. On the contrary, if there is no DC offset in the to-be-calibrated unit 12, symmetrical clipping will occur in the second signal Sc, i.e., the peaks and valleys of the second signal Sc are clipped to the same degree. Therefore, the receiving signal Sr may include merely odd harmonics without an even harmonic. The asymmetrical clipping results in even harmonics in the receiving signal Sr. Therefore, it may be determined that whether a DC offset presents in the to-be-calibrated unit 12 according to the presence of the even harmonics in the receiving signal Sr. In other words, the even harmonics in the receiving signal Sr may arise from the DC offset of the to-be-calibrated unit 12.

FIG. 3 shows a waveform of symmetrical clipping, where the horizontal axis represents the time t in microseconds (µs), and the vertical axis represents the voltage Vin volts. As shown in FIG. 3, the to-be-calibrated unit 12 has no DC offset, and symmetrical clipping occurs in the output signal (i.e., the second signal Sc), where the peak (approximately between 1.5 us and 3.5 µs) and the valley (approximately between 6.5 us and 8.5 µs) are clipped to the same degree. FIG. 4 shows the frequency components of the symmetrically clipped waveform in FIG. 3, where the horizontal axis represents the frequency index n and the vertical axis represents the magnitude in dB. FIG. 4 shows that the frequency components 41, 43, 45, and 47 have larger magnitudes, and they represent the fundamental frequency, 3rd harmonic, 5th harmonic, 7th harmonic respectively. In this example, the magnitudes of the even harmonics are small or undetectable.

FIG. 5 shows a waveform of asymmetrical clipping. As shown in FIG. 5, there is a DC offset in the to-be-calibrated unit 12, and the asymmetric clipping occurs in the output signal (i.e., the second signal Sc), where the peak (approximately between 1.8 us and 3.2 μs) and the valley (approximately between 6 μs and 9 μs) are clipped to different degrees. FIG. 6 shows the frequency components of the asymmetrically clipped waveform in FIG. 5. In FIG. 6, the frequency components 60 to 67 have larger magnitudes, and they represent the fundamental frequency, the 3rd harmonic, the 5th harmonic, and the 7th harmonic, respectively. The frequency components 60, 62, 64 and 66 represent the DC component, the 2nd harmonic, the 4th harmonic and the 6th harmonic, respectively. Therefore, when the to-be-calibrated unit 12 has a DC offset, the measurement unit 12 may detect even harmonics. In addition, the measurement unit 12 may detect odd harmonics regardless of symmetrical clipping or asymmetrical clipping.

In the above embodiments, in order to eliminate the DC offset on the transmission path of the communication circuit 1, there is no DC offset measurement circuit provided on the transmission path. In the communication circuit 1, the measurement unit and the compensating unit on the receiving path may be utilized to eliminate the DC offset on the transmitting path (for example, the DC offset of the to-be-calibrated unit), resulting in reduced circuit area and manufacture cost.

Figure 2:
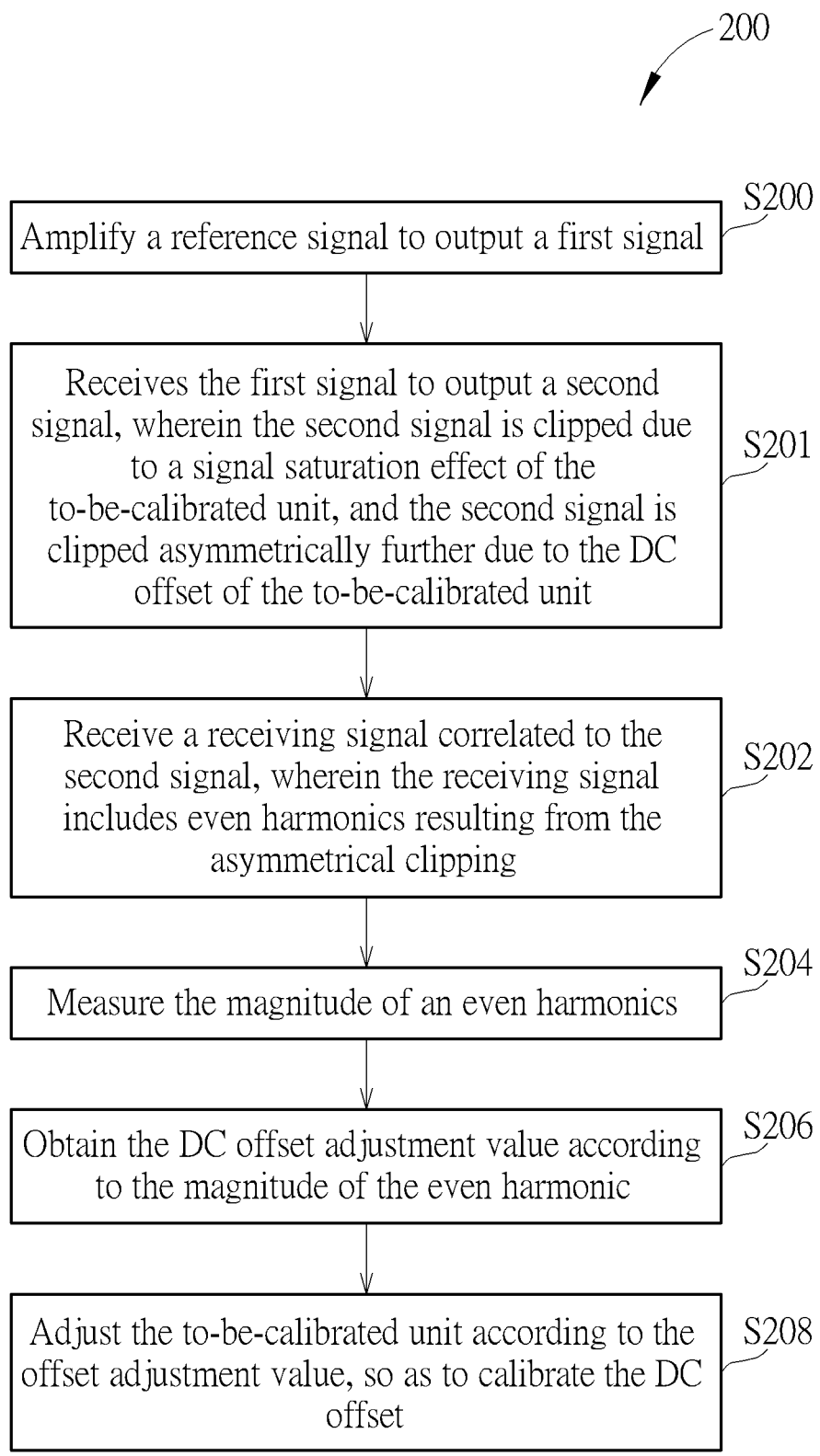
FIG. 2 is a flowchart of a DC offset calibration method of the DC offset calibration device in FIG. 1.

FIG. 2 is a flowchart of a DC offset calibration method 200 of the DC offset calibration device 10. The method 200 includes Steps S200 to S208. Steps S200 and S201 are used to generate a clipped signal such as the second signal Sc, and Steps S202 to S208 are used to calibrate the DC offset of the to-be-calibrated unit 12 according to the magnitude of an even harmonic. Any reasonable step change or adjustment is within the scope of the present disclosure. Steps S200 to S208 are detailed as follows:

Step S200: The signal generation unit 11 generates a reference signal Sref and amplifies the same to output a first signal Sa;

Step S201: The to-be-calibrated unit 12 receives the first signal Sa to output a second signal Sc, wherein the second signal Sc is clipped due to a signal saturation effect of the to-be-calibrated unit 12, and the second signal Sc is clipped asymmetrically further due to the DC offset of the to-be-calibrated unit 12;

Step S202: The measurement unit 13 receives a receiving signal Sr correlated to the second signal Sc, wherein the receiving signal Sr includes even harmonics resulting from asymmetrical clipping;

Step S204: The measurement unit 13 measures the magnitude Mag of an even harmonics;

Step S206: The compensation unit 14 obtains the DC offset adjustment value OFST according to the magnitude Mag of the even harmonic;

Step S208: The DC offset calibration circuit 120 adjusts the to-be-calibrated unit 12 according to the DC offset adjustment value OFST, so as to calibrate the DC offset.

Figure 8:
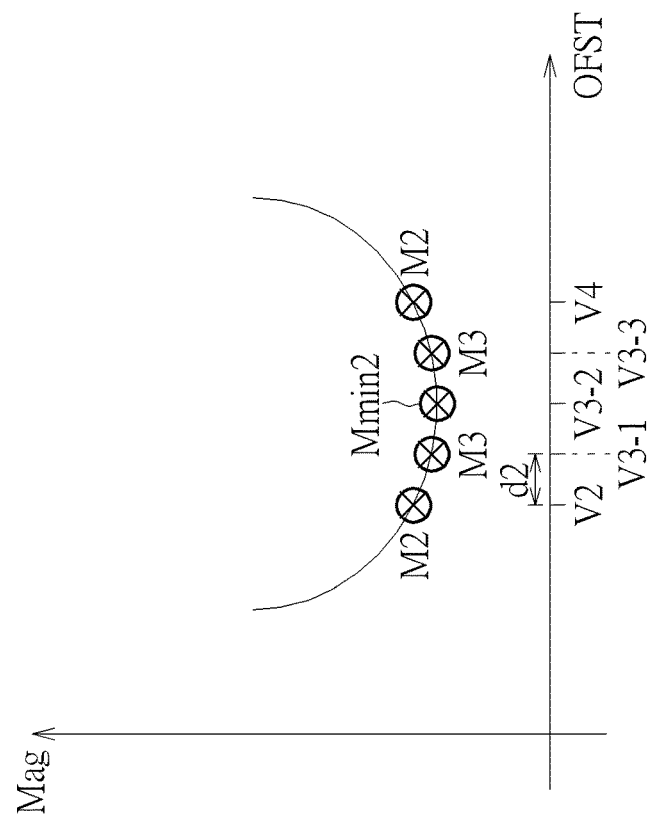
FIG. 8 shows the DC offset response of even harmonics at a second interval.
Figure 7:
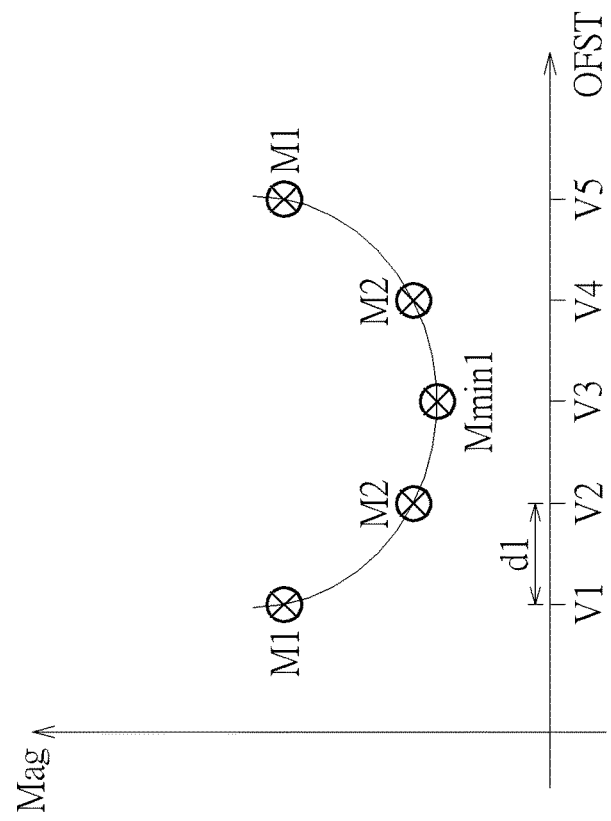
FIG. 7 shows the DC offset response of even harmonics at a first interval.

The explanations of Steps S200 has been provided in the preceding paragraphs, and will not be repeated here for brevity. Steps S201 to S208 are explained as follows with reference to FIG. 7 and FIG. 8. FIGS. 7 and 8 show the DC offset responses of the even harmonics at the first interval and the second interval, respectively, where the horizontal axis represents the DC offset adjustment value OFST, and the vertical axis represents the magnitude Mag.

Referring to FIG. 7, Steps S201 and S204 may be executed cyclically to obtain the minimum magnitude in the first predetermined range. The computation circuit 140 may sweep the first predetermined range at the first interval (i.e., step size) to obtain a coarse minimum magnitude of an even harmonic. For example, the first predetermined range may be between v1 to v5, the first interval may be d1, and the even harmonic may be the 2nd harmonic. In the first cycle, the computation circuit 140 sets the DC offset adjustment value OFST as v1, and the DC offset calibration circuit 120 changes the DC level of the to-be-calibrated unit 12 accordingly. The to-be-calibrated unit 12 outputs the second signal Sc which is clipped. The measurement unit 13 receives the receiving signal Sr correlated to the second signal Sc (Step S202), and measures the magnitude M1 of the second harmonic (Step S204). The second to fifth cycles are performed in a similar manner, so as to obtain various magnitudes of the 2nd harmonics corresponding to the various DC offset adjustment values OFST of v2, v3, v4 and v5, respectively, and the various magnitudes may be M2, Mmin1, M2 and M1, respectively. Thus the magnitude sweep of the 2nd harmonic for the first predetermined range is completed. In this embodiment, the memory 142 may store five DC offset adjustment values OFST (v1, v2, v3, v4 and v5) in the first predetermined range and five corresponding magnitudes of the second harmonic (M1, M2, Mmin1, M2 and M1).

Since the magnitude Mmin1 is less than the magnitudes M1 and M2, it may be determined that the magnitude Mmin1 may be the rough minimum magnitude in the first predetermined range, and that the preferred DC offset adjustment value OFST may be located near v3. According to the results of the first predetermined range, a second predetermined range is determined. The second predetermined range may be less than the first predetermined range and may cover the DC offset adjustment value OFST (i.e., v3) corresponding to the rough minimum magnitude Mmin1.

Referring to FIG. 8, the computation circuit 140 may continue to sweep the second predetermined range at the second interval to obtain a fine minimum magnitude of the 2nd harmonic. For example, the second predetermined range may be between v2 and v4, the second interval may be d2, and the second interval d2 may be less than the first interval d1. Similarly, when the DC offset adjustment values OFST are set to v2, v3-1, v3-2, v3-3 and v4, the corresponding magnitudes of the second harmonics of M2, M3, Mmin2, M3, and M2 may be obtained, respectively, so as to complete the magnitude sweep of the 2nd harmonic for the second predetermined range.

Since the magnitude Mmin2 is less than the magnitudes M2 and M3, it may be determined that the magnitude Mmin2 may be the minimum magnitude in the second predetermined range, and that the preferred DC offset adjustment value OFST may be located near v3-2. The computation circuit 140 may compare the magnitude Mmin2 with a predetermined value. If the magnitude Mmin2 is equal to or less than the predetermined value, value v3-2 may be output as the preferred DC offset adjustment value OFST to the DC offset calibration circuit 120 (Step S206).

In the above embodiment, the magnitude sweep across the second predetermined range may be omitted. In such a case, the computation circuit 140 may compare the magnitude Mmin1 with the predetermined value. If the magnitude Mmin1 is equal to or less than the predetermined value, value v3 may be output as the preferred DC offset adjustment value OFST to the DC offset calibration circuit 120. In other embodiments, the DC offset calibration method 200 may sweep a smaller predetermined range at a smaller interval to obtain a finer minimum magnitude of the 2nd harmonic based on the principle outlined in the present invention.

In Step S208, the DC offset calibration circuit 120 adjusts the to-be-calibrated unit 12 according to the preferred DC offset adjustment value OFST to calibrate the DC offset.

In the DC offset calibration device and the DC offset calibration method according to the embodiments of the present invention, in order to eliminate the DC offset on the transmission path of the communication circuit 1, there is no DC offset measurement circuit provided on the transmission path. In the communication circuit 1, the measurement unit and the compensating unit on the receiving path may be utilized to eliminate the DC offset on the transmitting path, resulting in reduced circuit area and manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A direct current (DC) offset calibration device comprising:
    a signal generation unit configured to provide a first signal;
    a to-be-calibrated unit coupled to the signal generation unit, the to-be-calibrated unit being configured to receive the first signal and output a second signal accordingly, wherein the second signal is a clipped signal;
    a measurement unit coupled to the to-be-calibrated unit, the measurement unit being configured to receive a receiving signal correlated to the second signal, the receiving signal comprising an even harmonic resulted from the clipped signal, the measurement unit being configured to measure a magnitude of the even harmonic; and
    a compensation unit coupled to the measurement unit and the to-be-calibrated unit, the compensation unit being configured to compute and obtain a DC offset adjustment value according to the magnitude of the even harmonic, and to adjust the to-be-calibrated unit according to the DC offset adjustment value.

2. The DC offset calibration device of claim 1, wherein the signal generation unit comprises:
    a signal generator configured to generate a reference signal; and
    a signal amplifier coupled to the signal generator, the signal amplifier being configured to receive the reference signal and amplify the reference signal to output the first signal.

3. The DC offset calibration device of claim 2, wherein: the signal generator comprises a sine wave generator and the reference signal comprises a sine wave; and
    the signal amplifier comprises a variable gain amplifier.

4. The DC offset calibration device of claim 1, wherein the receiving signal is the second signal.

5. The DC offset calibration device of claim 1, wherein:
    by a transmitting antenna, the second signal is transmitted to generate a first wireless signal; and
    by a receiving antenna, a second wireless signal correlated to the first wireless signal is received and the receiving signal is generated according to the second wireless signal.

6. The DC offset calibration device of claim 1, wherein the measurement unit comprises:
    an analog-to-digital converter configured to generate a digital signal according to the receiving signal; and
    a harmonic measurement circuit coupled to the analog-to-digital converter, and configured to obtain the magnitude of the even harmonic according to the digital signal.

7. The DC offset calibration device of claim 1, wherein the to-be-calibrated unit comprises:
    a to-be-calibrated circuit; and
    a DC offset calibration circuit coupled to the to-be-calibrated circuit, the DC offset calibration circuit being configured to adjust a DC level of the to-be-calibrated circuit according to the DC offset adjustment value.

8. The DC offset calibration device of claim 7, wherein:
    the DC offset calibration circuit comprises a variable resistor, and the DC offset calibration circuit being configured to change a resistance of the variable resistor according to the DC offset adjustment value, so as to adjust the DC level of the to-be-calibrated circuit.

9. The DC offset calibration device of claim 7, wherein:
    the DC offset calibration circuit comprises a DC compensation circuit configured to provide a calibration value according to the DC offset adjustment value to compensate for the DC level of the to-be-calibrated circuit.

10. The DC offset calibration device of claim 7, wherein the to-be-calibrated circuit comprises a digital-to-analog converter, an analog-to-digital converter, a mixer, a power amplifier, a low-noise amplifier, and/or an operational amplifier.

11. The DC offset calibration device of claim 10, wherein the power amplifier comprises a variable gain amplifier (VGA) and/or a transconductance amplifier.

12. The DC offset calibration device of claim 1, wherein the signal generation unit and the to-be-calibrated unit are arranged in a transmission path, and the measurement unit is arranged in a reception path.

13. The DC offset calibration device of claim 1, wherein the compensation unit is configured to adjust the to-be-calibrated unit according to the DC offset adjustment value, so as to reduce a magnitude of a next even harmonic measured by the measurement unit.

14. The DC offset calibration device of claim 13, wherein the compensation unit is configured to adjust the to-be-calibrated unit according to the DC offset adjustment value, such that the magnitude of the next even harmonic measured by the measurement unit is equal to or less than a predetermined value.

15. The DC offset calibration device of claim 14, wherein:
    the predetermined value is correlated to a sensitivity of the measurement unit, or to a system specification of a communication circuit where the DC offset calibration device is used; and
    the compensation unit comprises a memory configured to store the DC offset adjustment value and the predetermined value.

16. A DC offset calibration method, used to calibrate a DC offset of a to-be-calibrated unit, the method comprising:
    the to-be-calibrated unit outputting a second signal, wherein the second signal is clipped due to a signal saturation effect of the to-be-calibrated unit, and wherein the second signal is clipped asymmetrically further due to the DC offset of the to-be-calibrated unit;

receiving a receiving signal correlated to the second signal, wherein the receiving signal includes an even harmonic resulting from asymmetrical clipping;

measuring a magnitude of the even harmonic;

computing a DC offset adjustment value according to the magnitude of the even harmonic; and adjusting the to-be-calibrated unit according to the DC offset adjustment value to calibrate the DC offset.

17. The method of claim 16, further comprising:

generating a reference signal;

amplifying the reference signal to output a first signal; and by the to-be-calibrated unit, receiving the first signal and outputting the second signal accordingly.

18. The method of claim 16, further comprising:

by a transmitting antenna, transmitting the second signal to generate a first wireless signal; and by a receiving antenna, receiving a second wireless signal correlated to the first wireless signal and generating the receiving signal according to the second wireless signal.

19. The method of claim 16, wherein step of adjusting the to-be-calibrated unit according to the DC offset adjustment value comprises:

varying a resistance of a variable resistor according to the DC offset adjustment value to adjust a DC level of the to-be-calibrated unit; or providing a calibration value according to the DC offset adjustment value to compensate for the DC level of the to-be-calibrated unit.

20. The method of claim 16, wherein step of adjusting the to-be-calibrated unit according to the DC offset adjustment value comprises:

adjusting the to-be-calibrated unit according to the DC offset adjustment value to, so as to reduce a magnitude of a next even harmonic measured by the measurement unit until the magnitude of the next even harmonic measured by the measurement unit is equal to or less than a predetermined value.

\* \* \* \* \*